(12) United States Patent
He et al.

(10) Patent No.: US 12,395,604 B1
(45) Date of Patent: Aug. 19, 2025

(54) ELECTRICALLY-CONTROLLABLE COLOR FILTER ARRAY BASED ON PHASE-CHANGE MATERIAL, AND ARTIFICIAL VISION SYSTEM

(71) Applicant: HUAZHONG UNIVERSITY OF SCIENCE AND TECHNOLOGY, Hubei (CN)

(72) Inventors: Qiang He, Hubei (CN); Mengqian Cui, Hubei (CN); Yuxin Xie, Hubei (CN); Qingshan Tan, Hubei (CN); Hao Tong, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 19/189,212

(22) Filed: Apr. 24, 2025

Related U.S. Application Data

(63) Continuation of application No. PCT/CN2022/129593, filed on Nov. 3, 2022.

(30) Foreign Application Priority Data

Oct. 27, 2022 (CN) .......................... 202211330132.1

(51) Int. Cl.
*H04N 5/72* (2006.01)
*G02F 1/00* (2006.01)
(Continued)

(52) U.S. Cl.
CPC ............. *H04N 5/72* (2013.01); *G02F 1/0063* (2013.01); *G02F 1/213* (2021.01); *H04N 23/55* (2023.01); *G02F 2203/055* (2013.01)

(58) Field of Classification Search
CPC .......... H04N 5/72; H04N 23/55; G02F 1/213; G02F 1/0063; G02F 2203/055
(Continued)

(56) References Cited

U.S. PATENT DOCUMENTS

| 6,141,241 A | 10/2000 | Ovshinsky et al. | |
| 2015/0207066 A1* | 7/2015 | Ohba | H10B 63/80 257/4 |
| 2021/0210554 A1* | 7/2021 | Cheng | H10B 63/84 |

FOREIGN PATENT DOCUMENTS

CN 110622314 12/2019

OTHER PUBLICATIONS

"International Search Report (Form PCT/ISA/210) of PCT/CN2022/129593," mailed on Jul. 18, 2023, with English translation thereof, pp. 1-9.
(Continued)

*Primary Examiner* — Joel W Fosselman
(74) *Attorney, Agent, or Firm* — JCIPRNET

(57) ABSTRACT

An electrically-controllable color filter array based on a phase-change material, and an artificial vision system. The filter array includes a plurality of color filter units; each of the color filter units includes a metal layer, a bottom transparent conductive layer, a chalcogenide phase-change material layer, and a top transparent conductive layer; the red, green and blue filter function of each of the color filter units is adjusted according to the thickness of the bottom transparent conductive layer and the top transparent conductive layer; in the color filter units arranged in the array; the state transition of the chalcogenide phase-change material layer in each of the color filter units is realized by adjusting an electric pulse applied to the bit line and the word line where the electric pulse is present.

20 Claims, 8 Drawing Sheets

(51) Int. Cl.
*G02F 1/21* (2006.01)
*H04N 23/55* (2023.01)

(58) Field of Classification Search
USPC .......................................................... 348/360
See application file for complete search history.

(56) References Cited

OTHER PUBLICATIONS

"Written Opinion of the International Searching Authority (Form PCT/ISA/237) of PCT/CN2022/129593," mailed on Jul. 18, 2023, pp. 1-3.

* cited by examiner

ELECTRICALLY-CONTROLLABLE COLOR FILTER ARRAY BASED ON PHASE-CHANGE MATERIAL, AND ARTIFICIAL VISION SYSTEM

CROSS-REFERENCE TO RELATED APPLICATION

This application is a continuation of international PCT application serial no. PCT/CN 2022/129593, filed on Nov. 3, 2022, which claims the priority benefit of China application no. 202211330132.1, filed on Oct. 27, 2022. The entirety of each of the abovementioned patent applications is hereby incorporated by reference herein and made a part of this specification.

TECHNICAL FIELD

The present invention belongs to the field of image processing technology, more specifically, relates to an electrically-controllable color filter array based on a phase-change material and an artificial vision system.

DESCRIPTION OF RELATED ART

The development of artificial intelligence technology has made the accomplishment high computational efficiency and low power consumption particularly urgent, especially for image sensing systems based on artificial intelligence technology. However, in traditional CM OS image sensors based on the von Neumann computational architecture, the image sensing, storage, and processing units are physically separated, and the processing speed is limited by the memory wall and von Neumann bottleneck.

The Bayer filters (CFA), as an important component of image sensors, provides color information for sensing units. At present, organic dyes are widely used in CFAs to achieve RGB color selection. However, organic materials are prone to oxidation, which may cause issues such as fading and bleaching of colors in the CFAs. Further, due to their large thickness, there is often high optical crosstalk between adjacent pixels for light incident at large angles, leading to deterioration in color reconstruction.

Therefore, how to solve the problems of color distortion of filters and limited processing speed in conventional image sensors is an urgent issue that needs to be resolved.

SUMMARY

In light of the shortcomings of existing technologies, the purpose of the present invention is to provide an electrically-controllable color filter array and an artificial vision system based on a phase-change material, having stable structural colors and capable of providing non-volatile, anti-oxidation, and low crosstalk effects, integrating both filter and storage functions, effectively improving the processing speed of image sensors.

To achieve the above, in the first aspect, the present invention provides an electrically-controllable color filter array based on a phase-change material including a plurality of color filter units. The plurality of color filter units are arranged in an array in a first direction and a second direction intersecting each other. Each of the color filter units includes a substrate layer, a first metal layer, a bottom transparent conductive layer, a chalcogenide phase-change material layer, and a top transparent conductive layer arranged from bottom to top. Red, green and blue filter functions of each of the color filter units are adjusted according to thickness of the bottom transparent conductive layer and thickness of the top transparent conductive layer.

In the color filter units arranged in the array, the top transparent conductive layers in each row of color filter units are connected to a bit line BL, and the bottom transparent conductive layers in each column of color filter units are connected to a word line WL. A state transition of the chalcogenide phase-change material layer in each of the color filter units is realized by adjusting a width and voltage amplitude of an electric pulse applied to the bit line BL and the word line WL. States of the chalcogenide phase-change material layer include a high-resistance state and a low-resistance state, and the state transition of the chalcogenide phase-change material layer is utilized to enable data storage.

In the electrically-controllable color filter array based on the phase-change material provided by the present invention, the Fabry-Perot resonant cavity is formed through the use of the metal layer, the bottom transparent conductive layer, the chalcogenide phase-change material layer, and the top transparent conductive layer, and RGB three structural colors are obtained by adjusting the thickness of the bottom transparent conductive layer and the thickness of the top transparent conductive layer. Offering stable structural colors along with advantages such as non-volatility, oxidation resistance, and low crosstalk. Additionally, the electrically controllable color filter array provided by the invention can switch between high-resistance and low-resistance states by regulating Joule heating under electrical pulse stimulation, enabling data storage. This integration of storage and color filter functions effectively enhances the processing speed of image sensors.

In one of the embodiments, the chalcogenide phase-change material layer is made of materials of germanium telluride, antimony telluride, or germanium antimony telluride alloy, and the thickness of the chalcogenide phase-change material layer is 5 nm to 20 nm.

In one of the embodiments, when an electrical pulse with a pulse width of 300 ns to 500 ns and a voltage of 2V to 5V is applied, the chalcogenide phase-change material layer in the corresponding color filter unit transitions from the high-resistance state to the low-resistance state to implement a data write operation. When an electrical pulse with a pulse width of 100 ns to 200 ns and a voltage of 6V to 10V is applied, the chalcogenide phase-change material layer in the corresponding color filter unit transitions from the low-resistance state to the high-resistance state to implement a data erase operation.

In one of the embodiments, the thickness of the bottom transparent conductive layer and the thickness of the top transparent conductive layer in the color filter unit with the blue filter function are 50 nm to 70 nm and 150 nm to 180 nm respectively. The thickness of the bottom transparent conductive layer and the thickness of the top transparent conductive layer in the color filter unit with the green filter function are 80 nm to 100 nm and 170 nm to 200 nm respectively. The thickness of the bottom transparent conductive layer and the thickness of the top transparent conductive layer in the color filter unit with the red filter function are 100 nm to 130 nm and 60 nm to 80 nm respectively.

In one of the embodiments, each of the color filter units includes a second metal layer, and the second metal layer is arranged between the bottom transparent conductive layer and the chalcogenide phase-change material layer.

In one of the embodiments, the thickness of the bottom transparent conductive layer and the thickness of the top transparent conductive layer in the color filter unit with the blue filter function are 130 nm to 160 nm and 130 nm to 170 nm respectively. The thickness of the bottom transparent conductive layer and the thickness of the top transparent conductive layer in the color filter unit with the green filter function are 180 nm to 220 nm and 180 nm to 220 nm respectively. The thickness of the bottom transparent conductive layer and the thickness of the top transparent conductive layer in the color filter unit with the red filter function are 230 nm to 250 nm and 100 nm to 120 nm respectively.

In one of the embodiments, both the first metal layer and the second metal layer are made of a material of silver, platinum, or titanium.

In one of the embodiments, both the bottom transparent conductive layer and the top transparent conductive layer are made of a material of indium tin oxide or aluminum-doped zinc oxide.

In the second aspect, the present invention provides an artificial vision system including a microlens array, the abovementioned transmissive electrically-controllable color filter array, and a photosensitive array arranged in sequence.

The microlens array is configured to focus incident light onto the transmissive electrically-controllable color filter array.

The photosensitive array includes a plurality of photosensitive units arranged in an array. Each of the photosensitive units is connected to a corresponding color filter unit. The photosensitive array is configured to convert light intensity of the incident light with color information given by the electrically-controllable color filter array into an analog electrical signal and input the analog electrical signal to the electrically-controllable color filter array through a word line WL and a bit line BL, so as to store image information through the electrically-controllable color filter array or calculate the image information by using row and column selection circuits through a convolutional neural network.

In one of the embodiments, according to different application environments of the artificial vision system, the electrically-controllable color filter array is divided into homogeneous and heterogeneous color filter arrays. In the homogeneous color filter array, all color filter units are used together to complete an image information storage and calculation function. In the heterogeneous color filter array, some color filter units are used to complete a color filter function, while the remaining color filter units are used to implement the image information storage and calculation function.

SPECIFIC EMBODIMENTS

In order to make the objectives, technical solutions, and advantages of the present invention clearer and more comprehensible, the disclosure is further described in detail with reference to the drawings and embodiments. It should be understood that the specific embodiments described herein serve to explain the present invention merely and are not used to limit the present invention.

Figure 1:
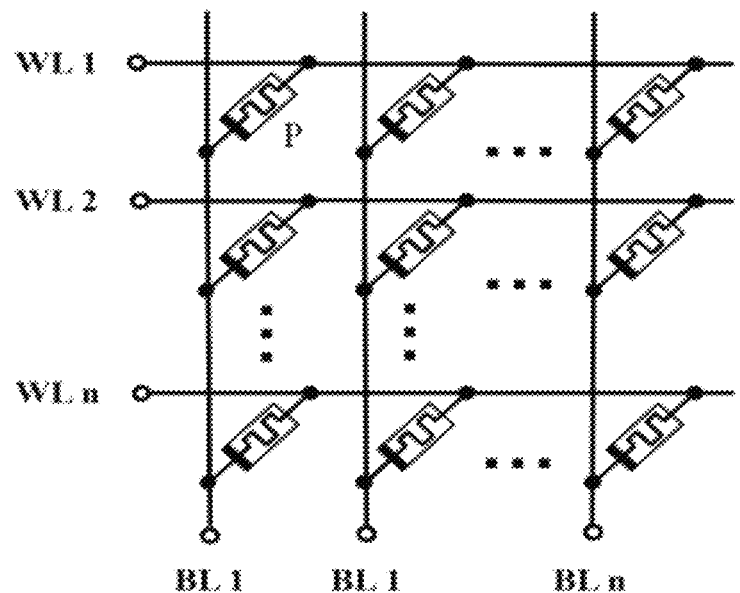
FIG. 1 is a schematic diagram of an array structure of an electrically-controllable color filter array provided by an embodiment of the present invention.

To solve the problems of color distortion in filter films and limited processing speed in traditional image sensors, the present invention provides an electrically-controllable color filter array based on a phase-change material is applied in an image sensor. As shown in FIG. 1, the electrically-controllable color filter array based on the phase-change material includes a plurality of color filter units P. These color filter units P are arranged in an array in a first direction and a second direction intersecting each other and form a cross array.

Figure 2:
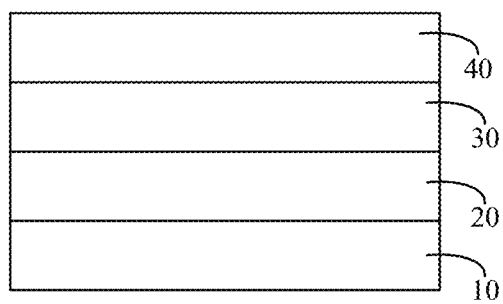
FIG. 2 is a schematic diagram of a film structure of a color filter unit provided by an embodiment of the present invention.

In this embodiment, as shown in FIG. 2, the color filter unit P includes a substrate layer (not shown), a metal layer 10, a bottom transparent conductive layer 20, a chalcogenide phase-change material layer 30, and a top transparent conductive layer 40 arranged from bottom to top, forming a Fabry-Perot resonant cavity. Herein, the substrate layer is made of an insulating material used to support the metal layer 10 and to allow light transmittance. The metal layer 10 may be made of a material of silver, platinum, or titanium, which may be used as a bottom electrode for an electrical operation of the color filter unit and may also be used as a semi-transparent reflective mirror to enhance the color selectivity of the color filter unit. Both the bottom transparent conductive layer 20 and the top transparent conductive layer 40 may be made of a material of indium tin oxide or aluminum-doped zinc oxide, used as the bottom electrode and a top electrode for the electrical operation of the color filter unit, and used as dielectric layers. By adjusting their thicknesses, the resonant wavelength can be tuned to achieve selective filtering of R/G/B colors. The chalcogenide phase-change material layer 30 may be made of a material of germanium telluride, antimony telluride, or germanium antimony telluride alloy, arranged between the two transparent conductive layers, used as a resistive switching active layer. That is, based on the electrical operation applied to the color filter unit, it dynamically transitions between a high-resistance state and a low-resistance state.

To be specific, the filtering principle of the electrically-controllable color filter array based on the phase-change material provided in this embodiment is as follows: After incident light with a specific frequency passes through the substrate layer and the metal layer 10 in sequence, then undergoes multiple reflections within the two dielectric layers (the bottom transparent conductive layer 20 and the top transparent conductive layer 40). Two waves propagating in opposite directions superimpose and finally form a standing wave in the Fabry-Perot resonant cavity. Since only the standing waves whose integer multiples of half-wavelength of the incident light exactly equal to a length of the resonant cavity are allowed to exist in the Fabry-Perot resonant cavity, waves that do not meet this condition are gradually attenuated. Therefore, the resonance wavelength can be adjusted by adjusting the thicknesses of the two dielectric layers, and light of a specific wavelength may be enhanced and transmitted, enabling the selection of red, green, and blue colors. Unlike traditional chemical colors using organic dyes, this structural color produced by optical resonant cavities is a physical color, and its thickness is only a few hundred nanometers, thus it offers advantages such as non-volatility, oxidation resistance, and low crosstalk.

Preferably, in the color filter unit with blue filtering functionality provided in this embodiment, the thicknesses of the bottom transparent conductive layer and the top transparent conductive layer can be set to 50-70 nm and 150-180 nm, respectively. For the color filter unit with green filtering functionality, the thicknesses of the bottom transparent conductive layer and the top transparent conductive layer can be set to 80-100 nm and 170-200 nm, respectively. In the color filter unit with red filtering functionality, the thicknesses of the bottom transparent conductive layer and the top transparent conductive layer can be set to 100-130 nm and 60-80 nm, respectively.

Further, the electrically-controllable color filter array based on the phase-change material provided in this embodiment also has a data storage function through corresponding electrical operations, and the specific implementation method is as follows: As shown in FIG. 1, the array-arranged color filter units include multiple rows and columns, where the top transparent conductive layer in each row of color filter units is connected to a bit line BL, and the bottom transparent conductive layer in each column of color filter units is connected to a word line WL. A state transition of the chalcogenide phase-change material layer in each of the color filter units is implemented by adjusting a width and voltage of an electrical pulse applied to its corresponding bit line BL and word line WL, so that the chalcogenide phase-change material layer in the color filter unit P may dynamically switch between the high-resistance state and the low-resistance state through the regulation of Joule heat under the stimulation of electrical pulse. Data write and erase are thereby implemented, and data storage is completed.

To be specific, when a wide and medium-intensity electrical pulse (pulse width of 300 ns to 500 ns, voltage of 2V to 5V) is applied to the color filter unit, the chalcogenide phase-change material layer in the color filter unit is stimulated to increase a material temperature above its crystallization temperature and transitions from the high-resistance state to the low-resistance state, and a data write (SET) operation, corresponding to logic 1, is implemented. When a short and strong electrical pulse (pulse width of 100 ns to 200 ns, voltage of 6V to 10V) is applied to the color filter unit, the chalcogenide phase-change material layer is melted and rapidly quenched, transitioning from the low-resistance state to the high-resistance state, and a data erase (RESET) operation, corresponding to logic 0, is implemented.

In addition, the electrically-controllable color filter array based on the phase-change material provided in this embodiment, since the Fabry-Perot resonant cavity only allows standing waves where an integer multiple of half the wavelength of the incident light equals the cavity length, waves that do not meet this condition are gradually attenuated. Moreover, transparent conductive layers as well as metal layers and the phase-change material layer are used in this embodiment to construct the Fabry-Perot resonant cavity, making each of the color filter units have high transmissivity or high color purity.

In the electrically-controllable color filter array based on the phase-change material provided in this embodiment, the Fabry-Perot resonant cavity is formed through the use of the metal layer, the bottom transparent conductive layer, the chalcogenide phase-change material layer, and the top transparent conductive layer, and RGB three structural colors are obtained by adjusting the thickness of the bottom transparent conductive layer and the thickness of the top transparent conductive layer. While having stable structural colors, advantages such as non-volatility, oxidation resistance, and low crosstalk are provided. Further, in the electrically-controllable color filter array provided by this embodiment, switching between the high-resistance state and the low-resistance state are achieved through the regulation of Joule heat under the stimulation of an electrical pulse, so data storage is implemented. This integration of storage and filtering functions effectively enhances the processing speed of image sensors.

Figure 3:
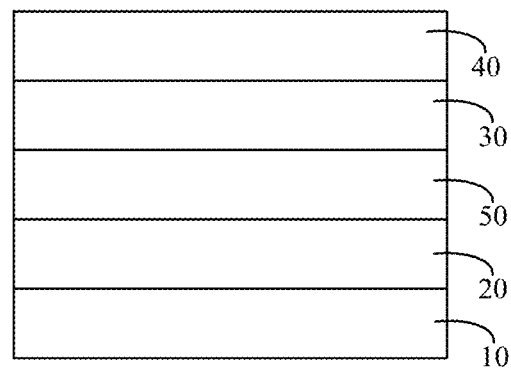
FIG. 3 is a schematic diagram of the film structure of the color filter unit provided by another embodiment of the present invention.

In an embodiment, as shown in FIG. 3, the transmissive electrically-controllable color filter array provided in the above embodiment may also include an additional metal layer 50, where the metal layer 50 is located between the bottom transparent conductive layer 20 and the chalcogenide phase-change material layer 30.

In this embodiment, by introducing an additional metal layer 50 between the bottom transparent conductive layer 20 and the chalcogenide phase-change material layer 30. The two semi-transparent and semi-reflective metal layers reflect more transmitted light back to the upper metal layer 50 enhancing the resonant absorption of the Fabry-Perot optical cavity in the dielectric layers, and the transmitted light is provided with higher purity color selectivity.

Specifically, in the color filter unit with blue filtering functionality provided in this embodiment, the thicknesses of the bottom transparent conductive layer and the top transparent conductive layer can be set to 130-160 nm and 130-170 nm, respectively. For the color filter unit with green filtering functionality, the thicknesses of the bottom transparent conductive layer and the top transparent conductive layer can be set to 180-220 nm and 180-220 nm, respectively. In the color filter unit with red filtering functionality, the thicknesses of the bottom transparent conductive layer and the top transparent conductive layer can be set to 230-250 nm and 100-120 nm, respectively.

Figure 4:
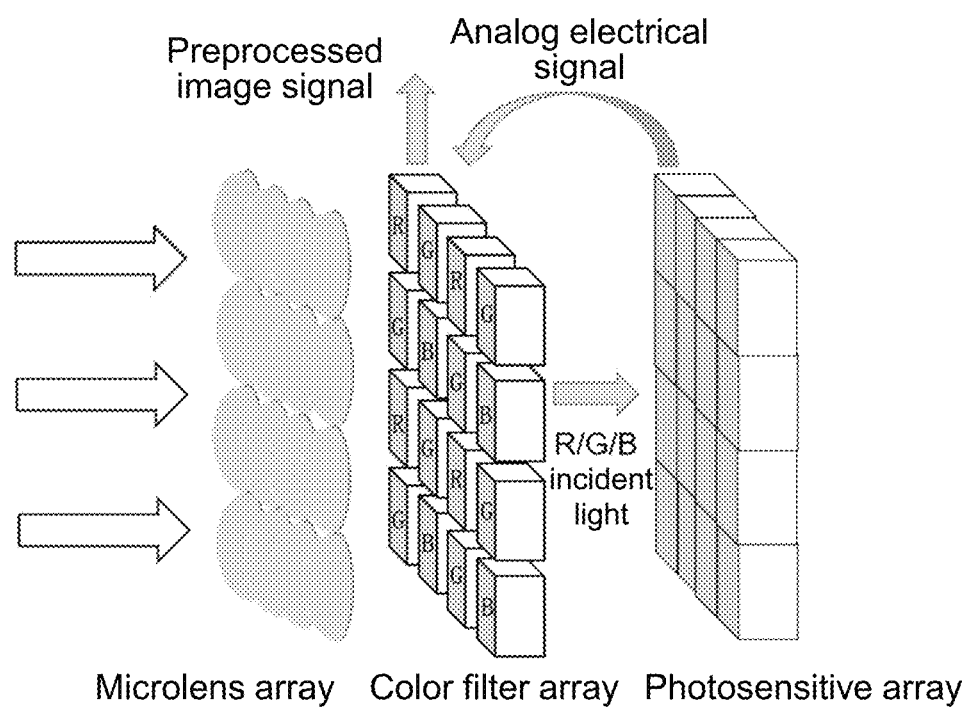
FIG. 4 is a schematic diagram of a structure of an artificial vision system provided by an embodiment of the present invention.

Based on the aforementioned inventive concept, the present invention also provides an artificial vision system, as shown in FIG. 4, including a microlens array, the transmissive electrically-controllable color filter array provided in the above embodiments, and a photosensitive array arranged.

Herein, the microlens array is configured to focus incident light onto the transmissive electrically-controllable color filter array.

Each of the color filter units in the transmissive electrically-controllable color filter array is designed to transmit one of the red, green, and blue colors while filtering out the other two. Since the human eyes are more sensitive to green, in the electrically-controllable color filter array provided in this embodiment, the colors transmitted by the color filter units in odd columns are uniformly arranged in red and green, while the colors transmitted by the color filter units in even columns are uniformly arranged in green and blue.

Figure 5:
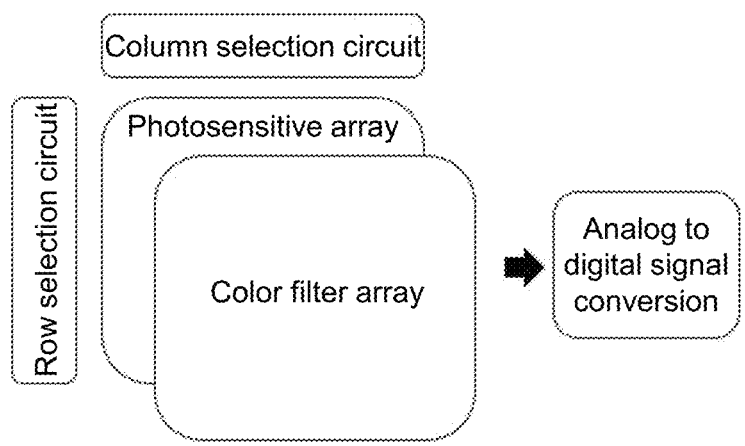
FIG. 5 is a functional block diagram of an artificial vision system provided by an embodiment of the present invention.

The photosensitive array includes a plurality of photosensitive units arranged in an array, and each of the photosensitive units corresponds to one color filter unit. The incident light, which is provided with the color information by the electrically-controllable color filter array, is projected onto the photosensitive array. The photosensitive array converts the light intensity into an analog electrical signal, which is then input into the electrically-controllable color filter array through word lines WL and bit lines BL. The electrically-controllable color filter array is used for image information storage, as shown in FIG. 5, Alternatively, using row and column selection circuits (based on general circuit principles such as Kirchhoff's law and Ohm's law) and leveraging convolutional neural networks, operations such as image compression and image recognition can be performed on the image information, thereby completing the processing of the image data.

Herein, the image compression algorithm based on the convolutional neural network mainly consists of several modules including an encoder, a quantization structure, entropy coding, and rate-distortion optimization. First, the data matrix representing image light intensity information is compressed for the first time through the encoder. An output result of the encoder is quantized through the quantization structure, and secondary compression of the image information is performed. Next, entropy coding is used to remove redundancy in feature vectors. Finally, rate-distortion optimization is used to balance image quality and compression efficiency. An image recognition model based on the convolutional neural network consists of a convolutional layer, a pooling layer, and a fully connected layer. The convolutional layer is responsible for extracting spatial features and reducing model parameters and computational complexity. The pooling layers perform feature extraction. Subsequently, with the help of the softmax function, the classification and recognition of image data is completed.

Further, to adapt to different application environments, the electrically-controllable color filter array provided in this embodiment may be divided into two types: homogeneous and heterogeneous color filter arrays. To be specific, when the vision system requires high-precision operation, the homogeneous color filter array is selected, where the electrical operation is performed on each color filter unit, and all color filter units are used for storing and computing the image information. When the vision system needs to operate with low power consumption, the heterogeneous color filter array is selected, where some color filter units only need to have the filter function, while the remaining color filter units are used to implement the image information storage and computation function.

In the artificial vision system provided in this embodiment, a photosensitive array is adopted, so that the analog signal generated by light stimulation be directly input into the color filter units without additional analog-to-digital signal conversion. Moreover, the artificial vision system is highly compatible with the traditional CMOS processes. The filter and storage-computation functions allow flexibly configured, without being limited by the light response wavelength. The process is mature with good reproducibility and high stability, enabling the perception of high-quality image information.

The following detailed explanation of the electrically-controllable color filter array based on the phase-change material and the artificial vision system provided by the present invention is given in combination with specific embodiments.

Embodiment 1

In Embodiment 1, the film layer structure of each of the color filter units in the electrically-controllable color filter array based on the phase-change material is, arranged from bottom to top, Ag/ITO/Ge$_2$Sb$_2$Te$_5$/ITO, where the thickness of the ITO layer is 40 nm to 200 nm.

The design method for transmissive active color filter units based on a phase-change material in this embodiment is as follows: (1) For the red color filter unit, the thickness of the Ag film layer is 10 nm, the thickness of the bottom ITO film layer is 125 nm, the thickness of the Ge$_2$Sb$_2$Te$_5$ film layer is 7 nm, and the thickness of the top ITO film layer is 80 nm. (2) For the green color filter unit, the thickness of the A g film layer is 10 nm, the thickness of the bottom ITO film layer is 90 nm, the thickness of the Ge$_2$Sb$_2$Te$_5$ film layer is 7 nm, and the thickness of the top ITO film layer is 180 nm. (3) For the blue color filter unit, the thickness of the A g film layer is 10 nm, the thickness of the bottom ITO film layer is 55 nm, the thickness of the Ge$_2$Sb$_2$Te$_5$ film layer is 7 nm, and the thickness of the top ITO film layer is 170 nm.

Figure 6:
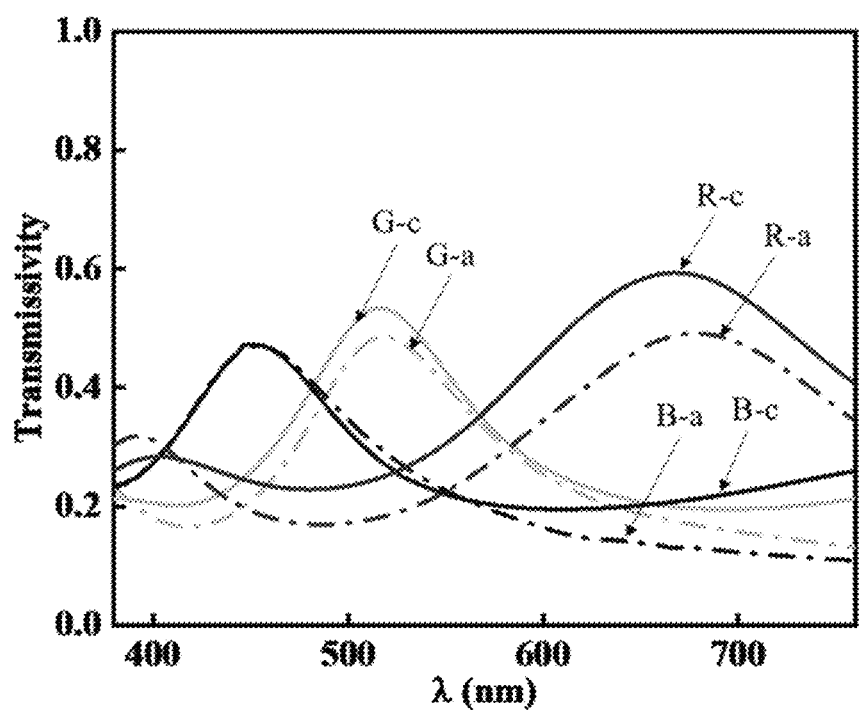
FIG. 6 is a transmission spectrum of the color filter unit obtained by simulation in Embodiment 1 of the present invention.
Figure 7:
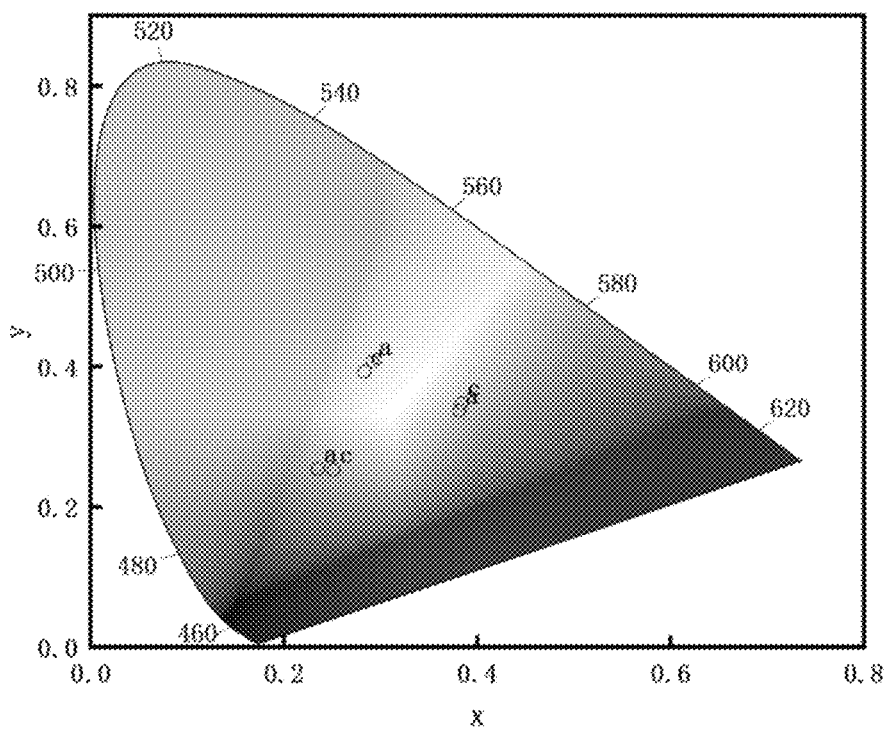
FIG. 7 is a chromaticity diagram of the color filter unit obtained by simulation in Embodiment 1 of the present invention.

Based on the above structure and parameters, software simulation is used to verify the transmissivity and color purity. As shown in FIG. 6 and FIG. 7, R/G/B-a and R/G/B-c represent the transmission spectra in the visible light range and the positions in the chromaticity diagram for red, green, and blue pixel units when the phase-change material is in an amorphous (a) and a crystalline (c) state, respectively. For the red color filter unit, the transmissivity in the amorphous state and the crystalline state is 49% and 59% respectively, with color purity of 35% and 37% respectively, resulting in changes of 10% in transmissivity and 2% in color purity. For the green color filter unit, the transmissivity in the amorphous state and the crystalline state is 49% and 53% respectively, with color purity of 40% and 44% respectively, resulting in changes of 4% in transmissivity and 4% in color purity. For the blue color filter unit, the transmissivity in both the amorphous state and the crystalline state is 47%, with color purity of 40% and 52% respectively, resulting in a change of 12% in color purity.

The simulation results demonstrate that the design method for the transmissive active color filter units based on the phase-change material provided in this embodiment is reliable. Active RGB color filter units with high transmissivity and good color purity. Moreover, the performance of units is not significantly affected by the phase-change behavior of the materials.

Figure 8:
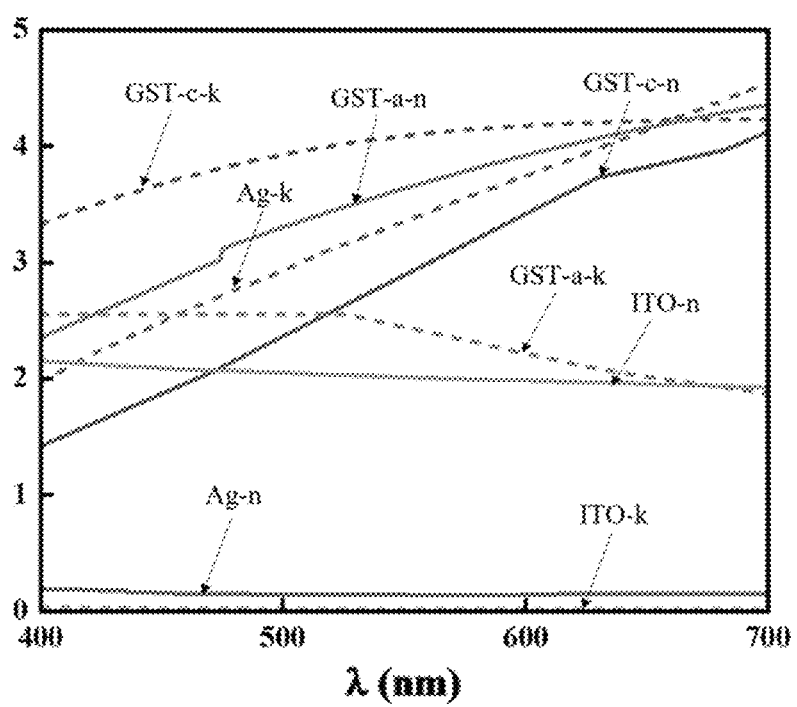
FIG. 8 is a dispersion curve chart of a refractive index (n) and an extinction coefficient (k) of each material provided by the present invention.

In the present invention, the steps to determine the transmissivity and color purity of the color filter units through software simulation are as follows:

Step 1: As shown in FIG. 8, the software is provided with information such as the dispersion curve of the refractive index (n) and the extinction coefficient (k) of the material in the visible light band of 400 nm to 700 nm. The refractive index and extinction coefficient are converted into a dielectric real part $\varepsilon_1$ and a dielectric imaginary part $\varepsilon_2$, and then polynomial fitting is performed in the software. In this embodiment, the polynomial fitting scheme is of order n, and the error range is 0.01.

The conversion method is as follows: $\varepsilon_1 = n^2 - k^2$ and $\varepsilon_2 = 2nk$.

Step 2: A film system of the color filter units is constructed, and each of the color filter units includes a metal layer, a transparent conductive electrode layer, a phase-change material layer, and a transparent conductive electrode layer arranged from bottom to top. In this embodiment, the multilayer film has dimensions of 500×500 nm in the xy-plane, and the incident light source is perpendicular to the xy-plane.

Step 3: The transmission spectrum obtained from the simulation is processed into chromaticity diagram using the Chromaticity Diagram module of OriginLab.

Embodiment 2

In this embodiment, the film layer structure of the color filter unit in the electrically-controllable color filter array based on phase-change material is, arranged from bottom to top, Ag/ITO/Ag/Ge$_2$Sb$_2$Te$_5$/ITO, where the thickness of the ITO layer is between 130 nm to 250 nm.

The design method for the transmissive active color filter units based on the phase-change material provided in this embodiment is as follows: (1) For the red color filter unit, the thickness of the Ag film layer is 15 nm, the thickness of the bottom ITO film layer is 115 nm, the thickness of the Ge$_2$Sb$_2$Te$_5$ film layer is 7 nm, and the thickness of the top ITO film layer is 240 nm. (2) For the green color filter unit, the thickness of the Ag film layer is 15 nm, the thickness of the bottom ITO film layer is 205 nm, the thickness of the Ge$_2$Sb$_2$Te$_5$ film layer is 7 nm, and the thickness of the top ITO film layer is 185 nm. (3) For the blue color filter unit, the thickness of the Ag film layer is 15 nm, the thickness of the bottom ITO film layer is 165 nm, the thickness of the Ge$_2$Sb$_2$Te$_5$ film layer is 7 nm, and the thickness of the top ITO film layer is 140 nm.

Figure 9:
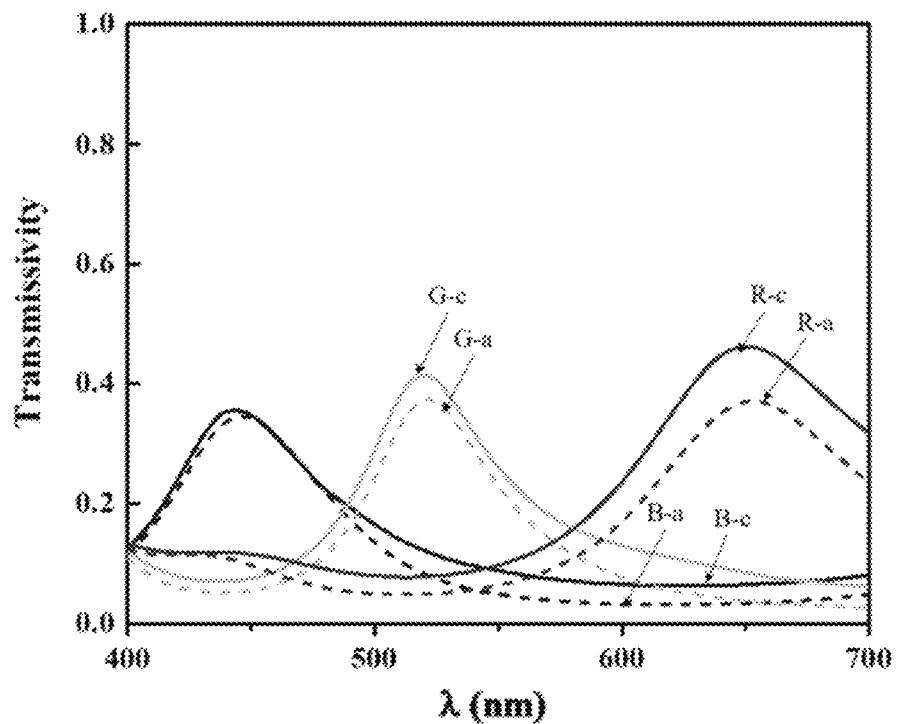
FIG. 9 is a transmission spectrum of the color filter unit obtained by simulation in Embodiment 2 of the present invention.
Figure 10:
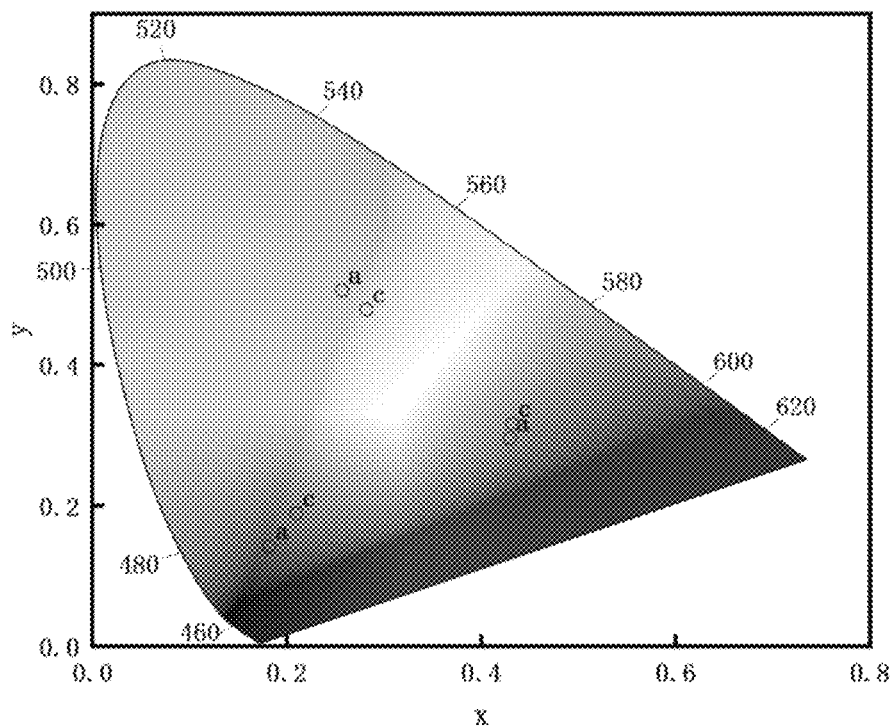
FIG. 10 is a chromaticity diagram of the color filter unit obtained by simulation in Embodiment 2 of the present invention.

Based on the above structure and parameters, software simulation is used to verify the transmissivity and color purity. As shown in FIG. 9 and FIG. 10, R/G/B-a and R/G/B-c represent the transmission spectra in the visible light range and the positions in the chromaticity diagram for red, green, and blue pixel units when the phase-change material is in the amorphous (a) and the crystalline (c) state, respectively. For the red color filter unit, the transmissivity in the amorphous state and the crystalline state is 37% and 46% respectively, with color purity of 60% and 53% respectively, resulting in changes of 9% in transmissivity and 7% in color purity. For the green color filter unit, the transmissivity in the amorphous state and the crystalline state is 38% and 41% respectively, with color purity of 72% and 100% respectively, resulting in changes of 3% in transmissivity and 28% in color purity. For the blue color filter unit, the transmissivity in the amorphous state and the crystalline state is 35% and 36% respectively, with color purity of 81% and 64% respectively, resulting in changes of 1% in transmissivity and 17% in color purity.

The simulation results demonstrate that the design method for the transmissive active color filter units based on the phase-change material provided in this embodiment is reliable. Active RGB color filter units with good transmissivity and high color purity, and the performance of units is not significantly affected by the phase-change behavior of the materials.

Embodiment 3

The present invention provides an electrically-controllable color filter array with filter and storage functions. The film layer structure of its color filter unit is the same as that in Embodiment 1 or Embodiment 2, enabling data storage functionality through electrical pulses.

Figure 11:
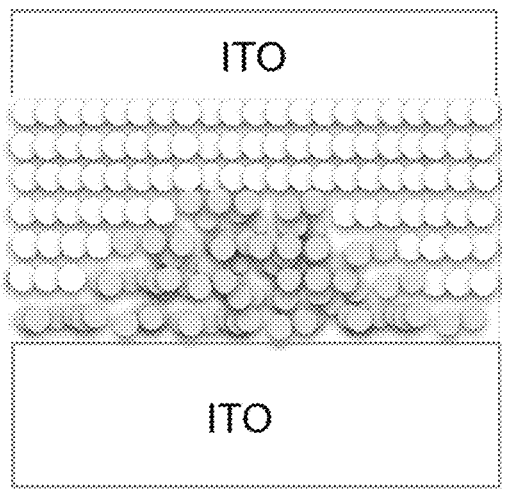
FIG. 11 is a schematic diagram of an electrical switching principle of the color filter unit provided by Embodiment 3 of the present invention.
Figure 12:
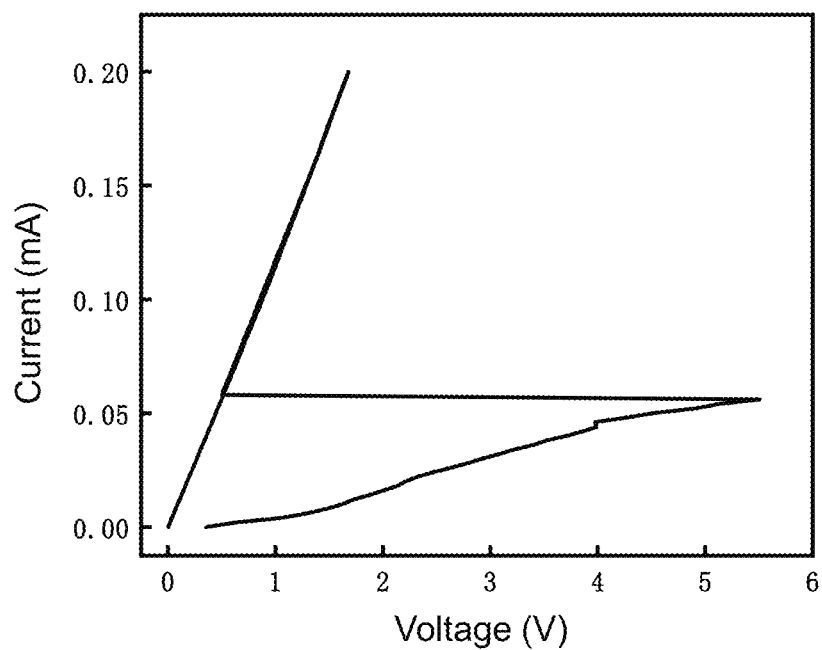
FIG. 12 is a direct current-voltage (I-V) characteristic curve chart of the color filter unit provided by Embodiment 3 of the present invention.
Figure 13:
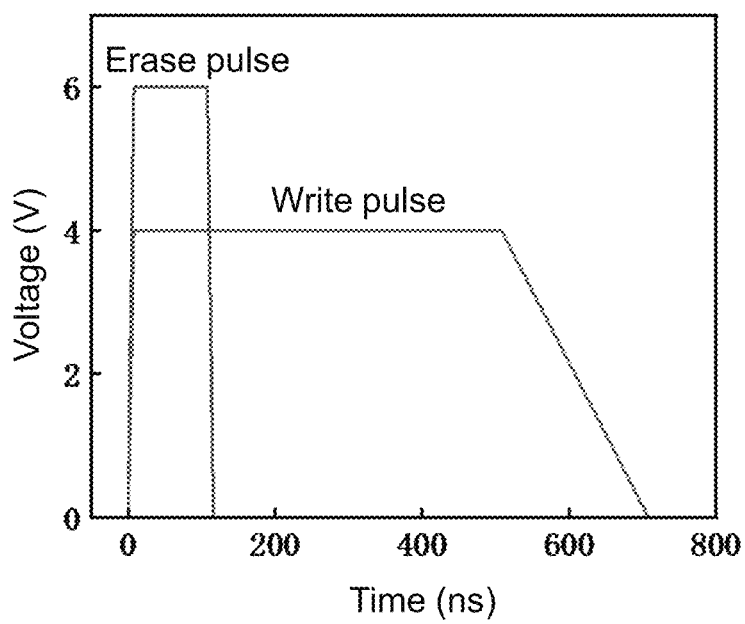
FIG. 13 is a schematic chart of shapes of write and erase pulses of the color filter unit provided by Embodiment 3 of the present invention.
Figure 14:
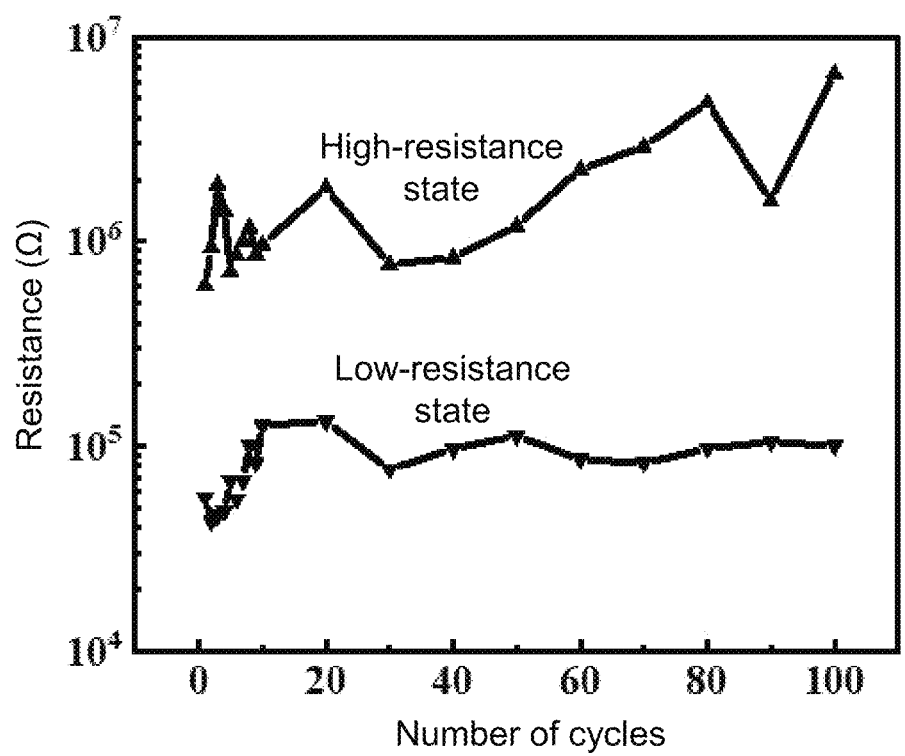
FIG. 14 is a cyclic characteristic chart of write and erase processes of the color filter unit provided by Embodiment 3 of the present invention.

The design method for a color filter unit with filter and storage functions in this embodiment is as follows: (1) The filtering function is the same as in Embodiment 1 or Embodiment 2, and can be selected according to the actual requirements for transmissivity and color purity performance. (2) The principle of implementing the storage function is shown in FIG. 11, where the Ge$_2$Sb$_2$Te$_5$ layer may be switched between the crystalline and amorphous states through the thermal effect produced by the electrical pulse. FIG. 12 is a direct current-voltage (I-V) characteristic curve chart of the color filter unit provided by this embodiment. As can be seen from FIG. 12, when the current increases to 0.056 mA, the voltage suddenly decreases, which means a sudden drop in resistance, indicating that Ge$_2$Sb$_2$Te$_5$ undergoes a phase change process from amorphous to crystalline state at this point. FIG. 13 illustrates shapes of write and erase pulses of the color filter unit provided by this embodiment, where the write pulse width is 500 ns, the pulse rising edge is 8 ns, the falling edge is 200 ns, and the voltage is 4 V. This corresponds to the process of Ge$_2$Sb$_2$Te$_5$ layer transitioning from amorphous to crystalline state and from high-resistance state to low-resistance state, implementing data writing (SET), corresponding to logic 1. The erase pulse width is 100 ns, the pulse rising edge is 8 ns, the falling edge is 8 ns, and the voltage is 6 V. This corresponds to the process of Ge$_2$Sb$_2$Te$_5$ layer transitioning from crystalline to amorphous state and from low-resistance state to high-resistance state, implementing data erasing (RESET), corresponding to logic 0. FIG. 14 is a cyclic characteristic chart of write and erase processes of the color filter unit provided by this embodiment. As can be seen from FIG. 14, after 100 cycles, a window of more than one order of magnitude can still be maintained between the high and low-resistance states, indicating that the electrically-controllable color filter array with the filter and storage functions designed based on the phase-change material has excellent storage characteristics.

Embodiment 4

Figure 15:
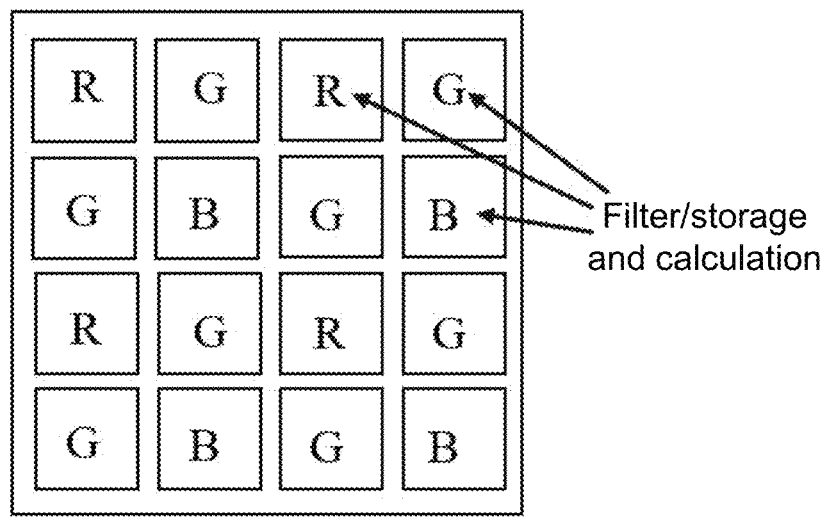
FIG. 15 is a functional schematic diagram of a homogeneous color filter array provided by Embodiment 4 of the present invention.

This embodiment provides an artificial vision system based on a homogeneous color filter array, as shown in FIG. 15, including a photosensitive array, an electrically-controllable color filter array, and a microlens array.

Herein, the photosensitive units in the photosensitive array may directly use the photosensors in a conventional CMOS image sensor. The film structure of the filter pixel units in the electrically-controllable color filter array is the same as that in Embodiment 1 or Embodiment 2. Different thicknesses of the ITO layer bring different color selectivity, which may remain nearly unchanged after the phase transition of the phase-change material.

The method for implementing the data storage function is as follows: An electrical pulse is applied to generate Joule heating, causing the phase-change material to dynamically switch between the high-resistance state and the low-resistance state, and data writing and erasing are performed. The method for implementing the image processing function involves using general circuit laws such as Kirchhoff's law and Ohm's law, combined with convolutional neural networks, to perform various operations and preprocessing on image information, including image compression and image recognition.

An artificial vision system based on a homogeneous color filter array is provided in this embodiment, where all color filter units complete the storage and preprocessing of image information together, and features such as high precision and low latency are provided.

Embodiment 5

Figure 16:
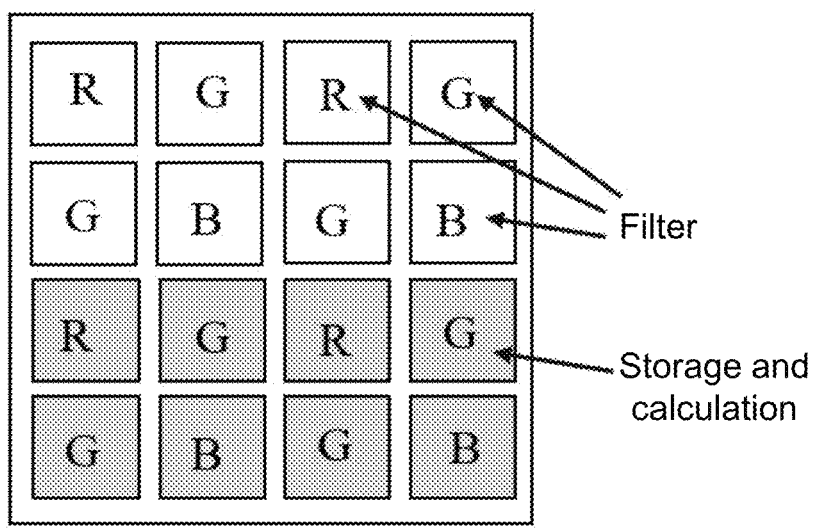
FIG. 16 is a functional schematic diagram of a heterogeneous color filter array provided by Embodiment 5 of the present invention.

The present invention provides an artificial vision system based on a heterogeneous color filter array, as shown in FIG. 16, including a photosensitive array, an electrically-controllable color filter array, and a microlens array. Herein, the photosensitive units in the photosensitive array may directly use the photosensors in a conventional CMOS image sensor. The film structure of the filter pixel units in the electrically-controllable color filter array is the same as that in Embodiment 1 or Embodiment 2. Different thicknesses of the ITO layer bring different color selectivity, which may remain nearly unchanged after the phase transition of the phase-change material.

The method for implementing the data storage function is as follows: An electrical pulse is applied to some color filter units to generate Joule heating, causing the phase-change material to dynamically switch between the high-resistance state and the low-resistance state, and data writing and erasing are performed. The method for implementing the image processing function involves using general circuit laws such as Kirchhoff's law and Ohm's law, combined with convolutional neural networks, to perform various operations and preprocessing on image information, including image compression and image recognition.

An artificial vision system based on a color filter array with flexibly configurable functions provided in this embodiment has dynamically adjustable storage and calculation functions in its filter/storage-calculation array, which may meet different requirements for operating power consumption and power in various application environments.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

The invention claimed is:

1. An electrically-controllable color filter array based on a phase-change material, comprising a plurality of color filter units arranged in an array along a first direction and a second direction intersecting each other, each of the color filter units comprises a substrate layer, a first metal layer, a bottom transparent conductive layer, a chalcogenide phase-change material layer, and a top transparent conductive layer arranged from bottom to top, red, green and blue filter functions of each of the color filter units are adjusted according to thickness of the bottom transparent conductive layer and thickness of the top transparent conductive layer,
in the color filter units arranged in the array, the top transparent conductive layers in each row of the color filter units are connected to a bit line BL, and the bottom transparent conductive layers in each column of the color filter units are connected to a word line WL, a phase transition of the chalcogenide phase-change material layer in each of the color filter units is realized by adjusting a width and voltage amplitude of electrical pulses applied to the bit line BL and the word line WL, states of the chalcogenide phase-change material layer comprise a high-resistance state and a low-resistance state, and the state transition of the chalcogenide phase-change material layer is adjusted to implement data storage.

2. The electrically-controllable color filter array based on the phase-change material according to claim 1, wherein the chalcogenide phase-change material layer is made of a germanium telluride, antimony telluride, or germanium antimony telluride alloy material, and a thickness of the chalcogenide phase-change material layer is 5 nm to 20 nm.

3. The electrically-controllable color filter array based on the phase-change material according to claim 2, wherein when an electrical pulse with a pulse width of 300 ns to 500 ns and a voltage of 2V to 5V is applied, the chalcogenide phase-change material layer in the corresponding color filter unit transitions from the high-resistance state to the low-resistance state to implement a data write operation, and when an electrical pulse with a pulse width of 100 ns to 200 ns and a voltage of 6V to 10V is applied, the chalcogenide phase-change material layer in the corresponding color filter unit transitions from the low-resistance state to the high-resistance state to implement a data erase operation.

4. The electrically-controllable color filter array based on the phase-change material according to claim 3, wherein the thickness of the bottom transparent conductive layer and the thickness of the top transparent conductive layer in the color filter unit with the blue filter function are 50 nm to 70 nm and 150 nm to 180 nm respectively, the thickness of the bottom transparent conductive layer and the thickness of the top transparent conductive layer in the color filter unit with the green filter function are 80 nm to 100 nm and 170 nm to 200 nm respectively, and the thickness of the bottom transparent conductive layer and the thickness of the top transparent conductive layer in the color filter unit with the red filter function are 100 nm to 130 nm and 60 nm to 80 nm respectively.

5. An artificial vision system, comprising a microlens array, an electrically-controllable color filter array according to claim 4, and a photosensitive array arranged in sequence,
wherein the microlens array is configured to focus incident light onto the electrically-controllable color filter array,
the photosensitive array comprises a plurality of photosensitive units arranged in an array, each of the photosensitive units is connected to a corresponding color filter unit, the photosensitive array is configured to convert light intensity of the incident light with color information given by the electrically-controllable color filter array into an analog electrical signal, and input the analog electrical signal to the electrically-controllable color filter array through a word line WL and a word line BL, so as to store image information through the electrically-controllable color filter array, or calculate the image information by using row and column selection circuits through a convolutional neural network.

6. The artificial vision system according to claim 5, wherein according to different application environments of the artificial vision system, the electrically-controllable color filter array is divided into homogeneous and heterogeneous color filter arrays, in the homogeneous color filter array, all color filter units are used together to complete an image information storage and calculation function, and in the heterogeneous color filter array, some color filter units are used to complete a filter function, while the remaining color filter units are used to implement the image information storage and calculation function.

7. The electrically-controllable color filter array based on the phase-change material according to claim 3, wherein each of the color filter units further comprises a second metal layer, and the second metal layer is arranged between the bottom transparent conductive layer and the chalcogenide phase-change material layer.

8. The electrically-controllable color filter array based on the phase-change material according to claim 7, wherein the thickness of the bottom transparent conductive layer and the thickness of the top transparent conductive layer in the color filter unit with the blue filter function are 130 nm to 160 nm and 130 nm to 170 nm respectively, the thickness of the bottom transparent conductive layer and the thickness of the top transparent conductive layer in the color filter unit with the green filter function are 180 nm to 220 nm and 180 nm to 220 nm respectively, and the thickness of the bottom transparent conductive layer and the thickness of the top transparent conductive layer in the color filter unit with the red filter function are 230 nm to 250 nm and 100 nm to 120 nm respectively.

9. An artificial vision system, comprising a microlens array, an electrically-controllable color filter array according to claim 8, and a photosensitive array arranged in sequence,
wherein the microlens array is configured to focus incident light onto the electrically-controllable color filter array,
the photosensitive array comprises a plurality of photosensitive units arranged in an array, each of the photosensitive units is connected to a corresponding color filter unit, the photosensitive array is configured to convert light intensity of the incident light with color information given by the electrically-controllable color filter array into an analog electrical signal, and input the analog electrical signal to the electrically-controllable color filter array through a word line WL and a word line BL, so as to store image information through the electrically-controllable color filter array, or calculate the image information by using row and column selection circuits through a convolutional neural network.

10. The artificial vision system according to claim 9, wherein according to different application environments of the artificial vision system, the electrically-controllable color filter array is divided into homogeneous and heterogeneous color filter arrays, in the homogeneous color filter array, all color filter units are used together to complete an image information storage and calculation function, and in the heterogeneous color filter array, some color filter units are used to complete a filter function, while the remaining color filter units are used to implement the image information storage and calculation function.

11. The electrically-controllable color filter array based on the phase-change material according to claim 7, wherein both the first metal layer and the second metal layer are made of a material of silver, platinum, or titanium.

12. An artificial vision system, comprising a microlens array, an electrically-controllable color filter array according to claim 5, and a photosensitive array arranged in sequence,
wherein the microlens array is configured to focus incident light onto the electrically-controllable color filter array,
the photosensitive array comprises a plurality of photosensitive units arranged in an array, each of the photosensitive units is connected to a corresponding color filter unit, the photosensitive array is configured to convert light intensity of the incident light with color information given by the electrically-controllable color filter array into an analog electrical signal, and input the analog electrical signal to the electrically-controllable color filter array through a word line WL and a word line BL, so as to store image information through the electrically-controllable color filter array, or calculate the image information by using row and column selection circuits through a convolutional neural network.

13. The artificial vision system according to claim 12, wherein according to different application environments of the artificial vision system, the electrically-controllable color filter array is divided into homogeneous and heterogeneous color filter arrays, in the homogeneous color filter array, all color filter units are used together to complete an image information storage and calculation function, and in the heterogeneous color filter array, some color filter units are used to complete a filter function, while the remaining color filter units are used to implement the image information storage and calculation function.

14. An artificial vision system, comprising a microlens array, an electrically-controllable color filter array according to claim 3, and a photosensitive array arranged in sequence,
wherein the microlens array is configured to focus incident light onto the electrically-controllable color filter array,
the photosensitive array comprises a plurality of photosensitive units arranged in an array, each of the photosensitive units is connected to a corresponding color filter unit, the photosensitive array is configured to convert light intensity of the incident light with color information given by the electrically-controllable color filter array into an analog electrical signal, and input the analog electrical signal to the electrically-controllable color filter array through a word line WL and a word line BL, so as to store image information through the electrically-controllable color filter array, or calculate the image information by using row and column selection circuits through a convolutional neural network.

15. The artificial vision system according to claim 14, wherein according to different application environments of the artificial vision system, the electrically-controllable color filter array is divided into homogeneous and heterogeneous color filter arrays, in the homogeneous color filter array, all color filter units are used together to complete an image information storage and calculation function, and in the heterogeneous color filter array, some color filter units are used to complete a filter function, while the remaining color filter units are used to implement the image information storage and calculation function.

16. An artificial vision system, comprising a microlens array, an electrically-controllable color filter array according to claim 2, and a photosensitive array arranged in sequence, wherein the microlens array is configured to focus incident light onto the electrically-controllable color filter array, the photosensitive array comprises a plurality of photosensitive units arranged in an array, each of the photosensitive units is connected to a corresponding color filter unit, the photosensitive array is configured to convert light intensity of the incident light with color information given by the electrically-controllable color filter array into an analog electrical signal, and input the analog electrical signal to the electrically-controllable color filter array through a word line WL and a word line BL, so as to store image information through the electrically-controllable color filter array, or calculate the image information by using row and column selection circuits through a convolutional neural network.

17. The artificial vision system according to claim 16, wherein according to different application environments of the artificial vision system, the electrically-controllable color filter array is divided into homogeneous and heterogeneous color filter arrays, in the homogeneous color filter array, all color filter units are used together to complete an image information storage and calculation function, and in the heterogeneous color filter array, some color filter units are used to complete a filter function, while the remaining color filter units are used to implement the image information storage and calculation function.

18. The electrically-controllable color filter array based on the phase-change material according to claim 1, wherein both the bottom transparent conductive layer and the top transparent conductive layer are made of the material of indium tin oxide or aluminum-doped zinc oxide.

19. An artificial vision system, comprising a microlens array, an electrically-controllable color filter array according to claim 1, and a photosensitive array arranged in sequence, wherein the microlens array is configured to focus incident light onto the electrically-controllable color filter array, the photosensitive array comprises a plurality of photosensitive units arranged in an array, each of the photosensitive units is connected to a corresponding color filter unit, the photosensitive array is configured to convert light intensity of the incident light with color information given by the electrically-controllable color filter array into an analog electrical signal, and input the analog electrical signal to the electrically-controllable color filter array through a word line WL and a word line BL, so as to store image information through the electrically-controllable color filter array, or calculate the image information by using row and column selection circuits through a convolutional neural network.

20. The artificial vision system according to claim 19, wherein according to different application environments of the artificial vision system, the electrically-controllable color filter array is divided into homogeneous and heterogeneous color filter arrays, in the homogeneous color filter array, all color filter units are used together to complete an image information storage and calculation function, and in the heterogeneous color filter array, some color filter units are used to complete a filter function, while the remaining color filter units are used to implement the image information storage and calculation function.

\* \* \* \* \*